(12) United States Patent
Park et al.

(10) Patent No.: US 10,797,822 B2
(45) Date of Patent: Oct. 6, 2020

(54) MODULATOR AND MODULATION METHOD USING NON-UNIFORM 16-SYMBOL SIGNAL CONSTELLATION FOR LOW-DENSITY PARITY CHECK CODEWORD HAVING 2/15 CODE RATE

(71) Applicant: ELECTRONICS AND TELECOMMUNICATIONS RESEARCH INSTITUTE, Daejeon (KR)

(72) Inventors: Sung-Ik Park, Daejeon (KR); Sun-Hyoung Kwon, Daejeon (KR); Jae-Young Lee, Daejeon (KR); Heung-Mook Kim, Daejeon (KR); Nam-Ho Hur, Sejong-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 16/401,006

(22) Filed: May 1, 2019

(65) Prior Publication Data

US 2019/0260508 A1    Aug. 22, 2019

Related U.S. Application Data

(63) Continuation of application No. 15/368,287, filed on Dec. 2, 2016, now Pat. No. 10,320,521, which is a (Continued)

(30) Foreign Application Priority Data

Feb. 13, 2014  (KR) .................. 10-2014-0016860
Feb. 5, 2015   (KR) .................. 10-2015-0017771

(51) Int. Cl.
*G06F 11/00*     (2006.01)
*H04L 1/00*      (2006.01)
(Continued)

(52) U.S. Cl.
CPC ....... *H04L 1/0041* (2013.01); *H03M 13/1102* (2013.01); *H03M 13/116* (2013.01);
(Continued)

(58) Field of Classification Search
None
See application file for complete search history.

(56) References Cited

U.S. PATENT DOCUMENTS 5,689,568 A *  11/1997  Laborde ............. H04B 7/18532
                                                  370/314
8,391,403 B2*   3/2013  Golitschek Edler Von
                                 Elbwart ............... H04L 1/1893
                                                  375/295
(Continued)

FOREIGN PATENT DOCUMENTS

CA    2973181 A1     7/2016
EP    2525495 A1    11/2012
KR   101082592 B1   11/2011

OTHER PUBLICATIONS

M. C. Valenti and X. Xiang, "Constellation Shaping for Bit-Interleaved LDPC Coded APSK," in IEEE Transactions on Communications, vol. 60, No. 10, pp. 2960-2970, Oct. 2012 (Year: 2012).*

*Primary Examiner* — Daniel F. McMahon

(57) ABSTRACT

A modulator and a modulation method using a non-uniform 16-symbol signal constellation are disclosed. The modulator includes a memory and a processor. The memory receives a codeword corresponding to a low-density parity check (LDPC) code having a code rate of 2/15. The processor maps
(Continued)

the codeword to 16 symbols of the non-uniform 16-symbol signal constellation on a 4-bit basis.

6 Claims, 10 Drawing Sheets

Related U.S. Application Data continuation of application No. 14/618,923, filed on Feb. 10, 2015, now Pat. No. 9,543,982.

(51) Int. Cl.
  *H03M 13/11* (2006.01)
  *H03M 13/00* (2006.01)
  *H03M 13/25* (2006.01)
  *H03M 13/27* (2006.01)

(52) U.S. Cl.
  CPC .... *H03M 13/1148* (2013.01); *H03M 13/1185* (2013.01); *H03M 13/255* (2013.01); *H03M 13/2778* (2013.01); *H03M 13/2792* (2013.01); *H03M 13/616* (2013.01); *H03M 13/6552* (2013.01); *H04L 1/0058* (2013.01)

(56) References Cited

U.S. PATENT DOCUMENTS

| | | |
|---|---|---|
| 2006/0136799 A1 | 6/2006 | Choi et al. |
| 2007/0098110 A1* | 5/2007 | Schmidt ................ H04L 1/0041 375/298 |
| 2011/0090948 A1 | 4/2011 | Zhou et al. |
| 2013/0272451 A1 | 10/2013 | Lim et al. |
| 2015/0229334 A1* | 8/2015 | Park .................. H03M 13/6552 714/776 |
| 2015/0229335 A1* | 8/2015 | Park .................... H04L 27/3422 714/776 |
| 2015/0229336 A1* | 8/2015 | Park ...................... H04L 1/0071 714/776 |

* cited by examiner

MODULATOR AND MODULATION METHOD USING NON-UNIFORM 16-SYMBOL SIGNAL CONSTELLATION FOR LOW-DENSITY PARITY CHECK CODEWORD HAVING 2/15 CODE RATE

CROSS-REFERENCE TO RELATED APPLICATIONS

This application is a continuation of and claims priority to U.S. application Ser. No. 15/368,287 filed Dec. 2, 2016, which is a continuation of U.S. application Ser. No. 14/618,923 filed Feb. 10, 2015, now U.S. Pat. No. 9,543,982, which claims the benefit of Korean Patent Application Nos. 10-2014-0016860 and 10-2015-0017771, filed Feb. 13, 2014 and Feb. 5, 2015, respectively, which are hereby incorporated by reference herein in their entirety.

BACKGROUND

1. Technical Field

Embodiments of the present invention relate to symbol mapping using a non-uniform signal constellation and, more particularly, to a modulator for transmitting error correction coded data over a digital broadcast channel.

2. Description of the Related Art

Bit-Interleaved Coded Modulation (BICM) is bandwidth-efficient transmission technology, and is implemented in such a manner that an error-correction coder, a bit-by-bit interleaver and a high-order modulator are combined with one another.

BICM can provide excellent performance using a simple structure because it uses a low-density parity check (LDPC) coder or a Turbo coder as the error-correction coder. Furthermore, BICM can provide high-level flexibility because it can select modulation order and the length and code rate of an error correction code in various forms. Due to these advantages, BICM has been used in broadcasting standards, such as DVB-T2 and DVB-NGH, and has a strong possibility of being used in other next-generation broadcasting systems.

In spite of the above advantage, the BICM exhibits a considerable difference in connection with the Shannon limit in terms of capacity. In order to reduce the difference in connection with the Shannon limit, modulation using a desirable signal constellation is essential.

SUMMARY

At least one embodiment of the present invention is directed to the provision of a modulator and a modulation method that use a non-uniform signal constellation more efficient than a uniform signal constellation in order to transmit error correction coded data over a broadcast system channel.

At least one embodiment of the present invention is directed to the provision of a modulator and a modulation method for 16-symbol mapping, which are optimized for an LDPC coder having a code rate of 2/15 and can be applied to next-generation broadcast systems, such as ATSC 3.0.

In accordance with an aspect of the present invention, there is provided a modulator using a non-uniform 16-symbol signal constellation, including a memory configured to receive a codeword corresponding to a low-density parity check (LDPC) code having a code rate of 2/15; and a processor configured to map the codeword to 16 symbols of the non-uniform 16-symbol signal constellation on a 4-bit basis.

The 16 symbols may have non-uniform distances therebetween, and may include a first group of four symbols of a 1st quadrant, a second group of four symbols symmetric to the four symbols of the first group with respect to an imaginary axis, a third group of four symbols symmetric to the four symbols of the first group with respect to an origin, and a fourth group of four symbols symmetric to the four symbols of the first group with respect to a real axis.

A vector corresponding to the four symbols $w_0$, $w_1$, $w_2$ and $w_3$ of the first group may be w, a vector corresponding to the four symbols $w_4$, $w_5$, $w_6$ and $w_7$ of the second group may be −conj(w) (conj(w) is a function that outputs conjugate complex numbers of all elements of w), a vector corresponding to the four symbols $w_{12}$, $w_{13}$, $w_{14}$ and $w_{15}$ of the third group may be −w, and a vector corresponding to the four symbols $w_8$, $w_9$, $w_{10}$ and $w_{11}$ of the fourth group may be conj(w).

The amplitudes of real and imaginary components of two of the four symbols of the first group may be symmetric.

The four symbols of the first group may be $w_0$, $w_1$, $w_2$ and $w_3$, $|real(w_0)|=|imaginary(w_1)|$ (real(i) is a function that outputs a real component of i, imaginary(i) is a function that outputs an imaginary component of i, and i is an arbitrary complex number), $|real(w_1)|=|imaginary(w_0)|$, $|real(w_2)|=|imaginary(w_3)|$, and $|real(w_3)|=|imaginary(w_2)|$.

The 16 symbols may be defined as shown in the following Table:

TABLE

| w | Constellation |
|---|---|
| 0 | 0.7062 + 0.7075i |
| 1 | 0.7075 + 0.7062i |
| 2 | 0.7072 + 0.7077i |
| 3 | 0.7077 + 0.7072i |
| 4 | −0.7062 + 0.7075i |
| 5 | −0.7075 + 0.7062i |
| 6 | −0.7072 + 0.7077i |
| 7 | −0.7077 + 0.7072i |
| 8 | 0.7062 − 0.7075i |
| 9 | 0.7075 − 0.7062i |
| 10 | 0.7072 − 0.7077i |
| 11 | 0.7077 − 0.7072i |
| 12 | −0.7062 − 0.7075i |
| 13 | −0.7075 − 0.7062i |
| 14 | −0.7072 − 0.7077i |
| 15 | −0.7077 − 0.7072i |

In accordance with another aspect of the present invention, there is provided a modulation method using a non-uniform 16-symbol signal constellation, including receiving a codeword corresponding to an low-density parity check (LDPC) code having a code rate of 2/15; mapping the codeword to one of 16 symbols of the non-uniform 16-symbol signal constellation on a 4-bit basis; and adjusting any one or more of an amplitude and phase of a carrier in accordance with the mapping.

In accordance with still another aspect of the present invention, there is provided a BICM device, including an error correction coder configured to output an LDPC codeword having a code rate of 2/15; a bit interleaver configured to interleave the LDPC codeword on a bit group basis, corresponding to a parallel factor of the LDPC codeword, and then output the interleaved codeword; and a modulator configured to map the interleaved codeword to 16 symbols of a non-uniform 16-symbol signal constellation on a 4-bit basis.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
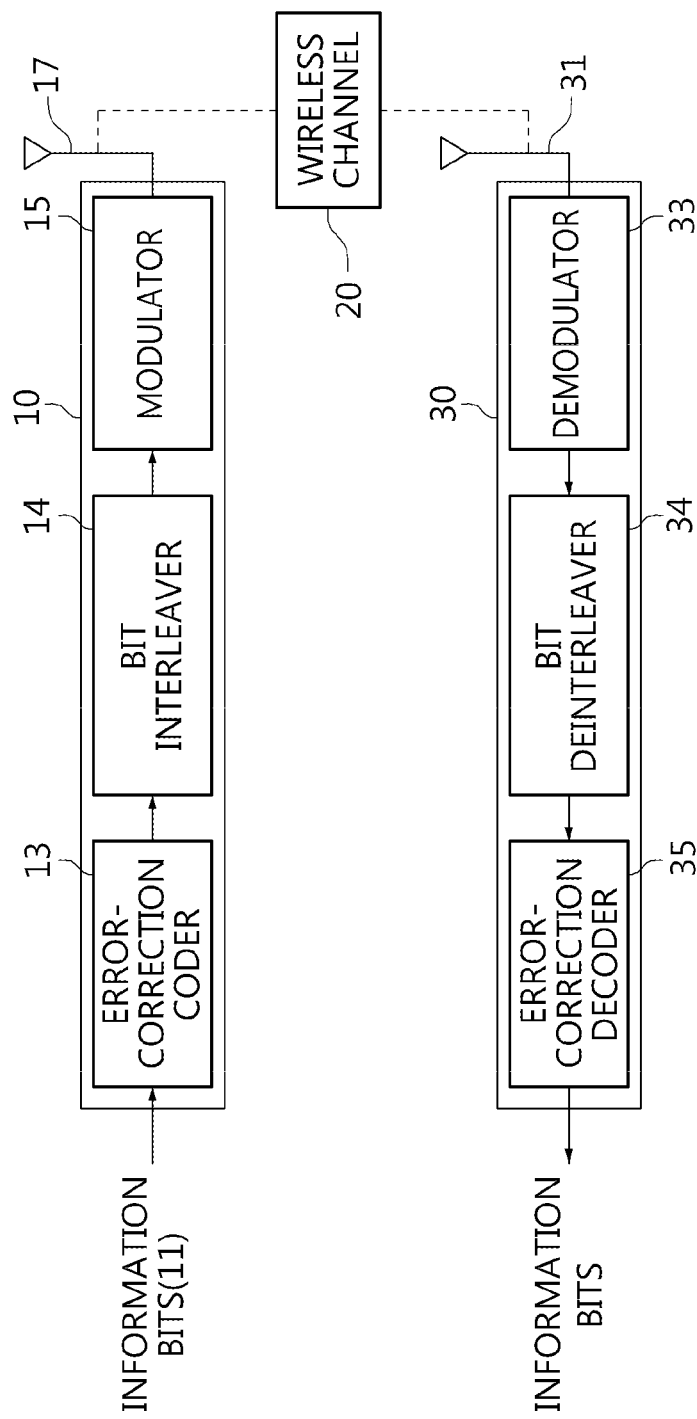
FIG. 1 is a block diagram illustrating a broadcast signal transmission and reception system according to an embodiment of the present invention.

Embodiments of the present invention will be described in detail below with reference to the accompanying drawings. Repeated descriptions and descriptions of well-known functions and configurations that have been deemed to make the gist of the present invention unnecessarily obscure will be omitted below. The embodiments of the present invention are intended to fully describe the present invention to persons having ordinary knowledge in the art to which the present invention pertains. Accordingly, the shapes, sizes, etc. of components in the drawings may be exaggerated to make the description obvious.

Embodiments of the present invention are described in detail below with reference to the accompanying drawings.

FIG. 1 is a block diagram illustrating a broadcast signal transmission and reception system according to an embodiment of the present invention.

Referring to FIG. 1, it can be seen that a BICM device 10 and a BICM reception device 30 communicate with each other over a wireless channel 20.

The BICM device 10 generates an n-bit codeword by encoding k information bits 11 using an error-correction coder 13. In this case, the error-correction coder 13 may be an LDPC coder or a Turbo coder.

The codeword is interleaved by a bit interleaver 14, and thus the interleaved codeword is generated.

In this case, the interleaving may be performed on a bit group basis (by a unit of a bit group). In this case, the error-correction coder 13 may be an LDPC coder having a length of 16200 and a code rate of 2/15. A codeword having a length of 16200 may be divided into a total of 45 bit groups. Each of the bit groups may include 360 bits, i.e., the parallel factor of an LDPC codeword.

In this case, the interleaving may be performed on a bit group basis (by a unit of a bit group) in accordance with an interleaving sequence, which will be described later.

In this case, the bit interleaver 14 prevents the performance of error correction code from being degraded by effectively distributing burst errors occurring in a channel. In this case, the bit interleaver 14 may be separately designed in accordance with the length and code rate of the error correction code and the modulation order.

The interleaved codeword is modulated by a modulator 15, and is then transmitted via an antenna 17.

In this case, the modulator 15 may be based on a concept including symbol mapper (symbol mapping device). In this case, the modulator 15 may be a symbol mapping device performing 16-symbol mapping which maps codes onto 16 constellations (symbols).

In this case, the modulator 15 may be a uniform modulator, such as a quadrature amplitude modulation (QAM) modulator, or a non-uniform modulator.

The modulator 15 may be a symbol mapping device performing NUC (Non-Uniform Constellation) symbol mapping which uses 16 constellations (symbols). That is, the modulator 15 may map the interleaved codeword to the 16 symbols of the non-uniform 16-symbol signal constellation on a 4-bit basis.

The signal transmitted via the wireless channel 20 is received via the antenna 31 of the BICM reception device 30, and, in the BICM reception device 30, is subjected to a process reverse to the process in the BICM device 10. That is, the received data is demodulated by a demodulator 33, is deinterleaved by a bit deinterleaver 34, and is then decoded by an error correction decoder 35, thereby finally restoring the information bits.

It will be apparent to those skilled in the art that the above-described transmission and reception processes have been described within a minimum range required for a description of the features of the present invention and various processes required for data transmission may be added.

Figure 2:
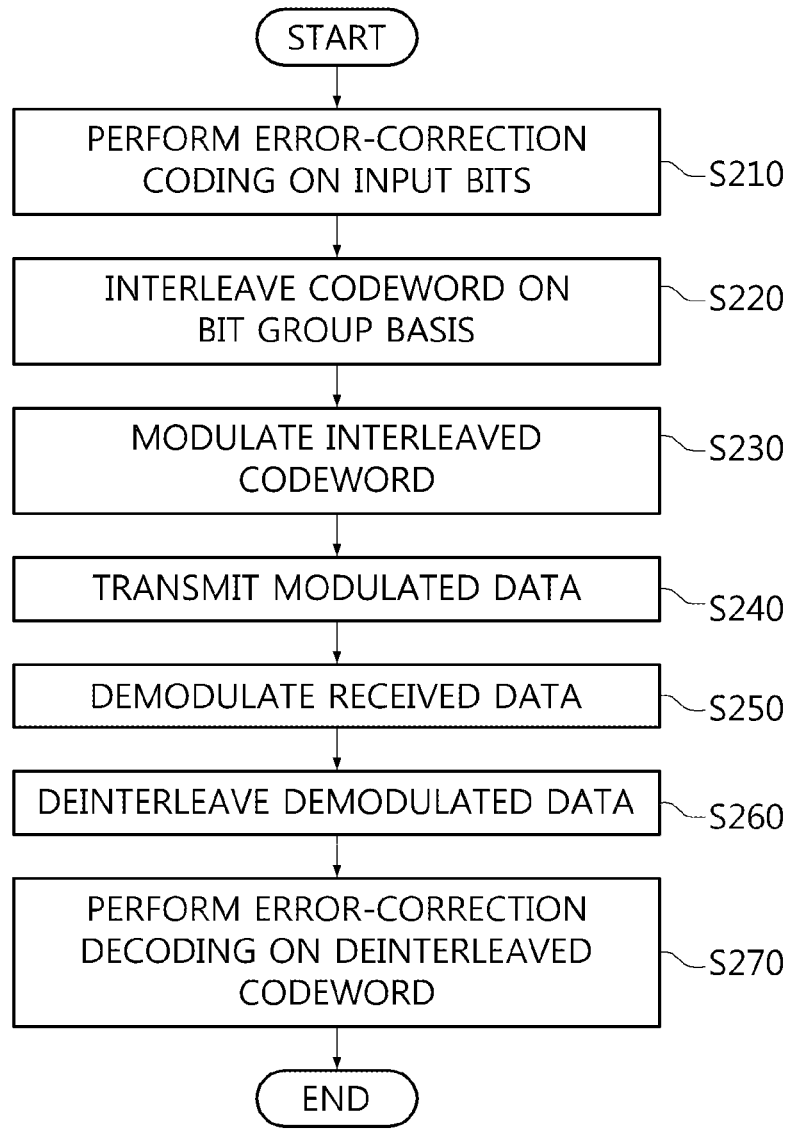
FIG. 2 is an operation flowchart illustrating a broadcast signal transmission and reception method according to an embodiment of the present invention.

FIG. 2 is an operation flowchart illustrating a broadcast signal transmission and reception method according to an embodiment of the present invention.

Referring to FIG. 2, in the broadcast signal transmission and reception method according to this embodiment of the present invention, input bits (information bits) are subjected to error-correction coding at step S210.

That is, at step S210, an n-bit codeword is generated by encoding k information bits using the error-correction coder.

In this case, step S210 may be performed as in an LDPC encoding method, which will be described later.

Furthermore, in the broadcast signal transmission and reception method, an interleaved codeword is generated by interleaving the n-bit codeword on a bit group basis at step S220.

In this case, the n-bit codeword may be an LDPC codeword having a length of 16200 and a code rate of 2/15. The codeword having a length of 16200 may be divided into a total of 45 bit groups. Each of the bit groups may include 360 bits corresponding to the parallel factors of an LDPC codeword.

In this case, the interleaving may be performed on a bit group basis (by a unit of a bit group) in accordance with an interleaving sequence, which will be described later.

Furthermore, in the broadcast signal transmission and reception method, the encoded data is modulated at step S230.

That is, at step S230, the interleaved codeword is modulated using the modulator.

In this case, the modulator may be based on a concept including symbol mapper (symbol mapping device). In this case, the modulator may be a symbol mapping device performing 16-symbol mapping which maps codes onto 16 constellations (symbols).

In this case, the modulator may be a uniform modulator, such as a QAM modulator, or a non-uniform modulator.

The modulator may be a symbol mapping device performing NUC (Non-Uniform Constellation) symbol mapping which uses 16 constellations (symbols).

Furthermore, in the broadcast signal transmission and reception method, the modulated data is transmitted at step S240.

That is, at step S240, the modulated codeword is transmitted over the wireless channel via the antenna.

Furthermore, in the broadcast signal transmission and reception method, the received data is demodulated at step S250.

That is, at step S250, the signal transmitted over the wireless channel is received via the antenna of the receiver, and the received data is demodulated using the demodulator.

Furthermore, in the broadcast signal transmission and reception method, the demodulated data is deinterleaved at step S260. In this case, the deinterleaving of step S260 may be reverse to the operation of step S220.

Furthermore, in the broadcast signal transmission and reception method, the deinterleaved codeword is subjected to error correction decoding at step S270.

That is, at step S270, the information bits are finally restored by performing error correction decoding using the error correction decoder of the receiver.

In this case, step S270 corresponds to a process reverse to that of an LDPC encoding method, which will be described later.

An LDPC code is known as a code very close to the Shannon limit for an additive white Gaussian noise (AWGN) channel, and has the advantages of asymptotically excellent performance and parallelizable decoding compared to a turbo code.

Generally, an LDPC code is defined by a low-density parity check matrix (PCM) that is randomly generated. However, a randomly generated LDPC code requires a large amount of memory to store a PCM, and requires a lot of time to access memory. In order to overcome these problems, a quasi-cyclic LDPC (QC-LDPC) code has been proposed. A QC-LDPC code that is composed of a zero matrix or a circulant permutation matrix (CPM) is defined by a PCM that is expressed by the following Equation 1:

$$H = \begin{bmatrix} J^{a_{11}} & J^{a_{12}} & \cdots & J^{a_{1n}} \\ J^{a_{21}} & J^{a_{22}} & \cdots & J^{a_{2n}} \\ \vdots & \vdots & \ddots & \vdots \\ J^{a_{m1}} & J^{a_{m2}} & \cdots & J^{a_{mn}} \end{bmatrix}, \text{ for } a_{ij} \in \{0, 1, \ldots, L-1, \infty\} \quad (1)$$

In this equation, J is a CPM having a size of L×L, and is given as the following Equation 2. In the following description, L may be 360.

$$J_{L \times L} = \begin{bmatrix} 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \\ 1 & 0 & 0 & \cdots & 0 \end{bmatrix} \quad (2)$$

Furthermore, $J^i$ is obtained by shifting an L×L identity matrix I ($J^0$) to the right i (0≤i<L) times, and $J^\infty$ is an L×L zero matrix. Accordingly, in the case of a QC-LDPC code, it is sufficient if only index exponent i is stored in order to store $J^i$, and thus the amount of memory required to store a PCM is considerably reduced.

Figure 3:
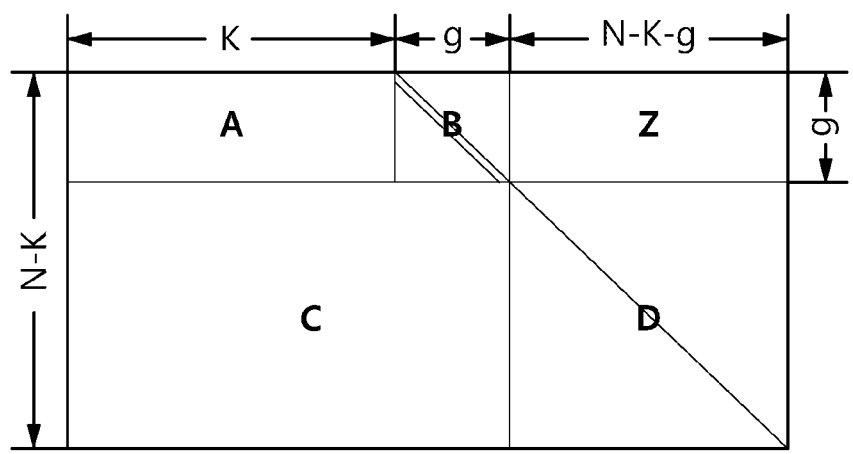
FIG. 3 is a diagram illustrating the structure of a parity check matrix (PCM) corresponding to an LDPC code to according to an embodiment of the present invention.

FIG. 3 is a diagram illustrating the structure of a PCM corresponding to an LDPC code to according to an embodiment of the present invention.

Referring to FIG. 3, the sizes of matrices A and C are g×K and (N−K−g)×(K+g), respectively, and are composed of an L×L zero matrix and a CPM, respectively. Furthermore, matrix Z is a zero matrix having a size of g×(N−K−g), matrix D is an identity matrix having a size of (N−K−g)× (N−K−g), and matrix B is a dual diagonal matrix having a size of g×g. In this case, the matrix B may be a matrix in which all elements except elements along a diagonal line and neighboring elements below the diagonal line are 0, and may be defined as the following Equation 3:

$$B_{g \times g} = \begin{bmatrix} I_{L \times L} & 0 & 0 & \cdots & 0 & 0 & 0 \\ I_{L \times L} & I_{L \times L} & 0 & \cdots & 0 & 0 & 0 \\ 0 & I_{L \times L} & I_{L \times L} & \vdots & 0 & 0 & 0 \\ \vdots & \vdots & \vdots & \ddots & \vdots & \vdots & \vdots \\ 0 & 0 & 0 & \cdots & I_{L \times L} & I_{L \times L} & 0 \\ 0 & 0 & 0 & \cdots & 0 & I_{L \times L} & I_{L \times L} \end{bmatrix} \quad (3)$$

where $I_{L \times L}$ is an identity matrix having a size of L×L.

That is, the matrix B may be a bit-wise dual diagonal matrix, or may be a block-wise dual diagonal matrix having identity matrices as its blocks, as indicated by Equation 3. The bit-wise dual diagonal matrix is disclosed in detail in Korean Patent Application Publication No. 2007-0058438, etc.

In particular, it will be apparent to those skilled in the art that when the matrix B is a bit-wise dual diagonal matrix, it is possible to perform conversion into a Quasi-cyclic form by applying row or column permutation to a PCM including the matrix B and having a structure illustrated in FIG. 3.

In this case, N is the length of a codeword, and K is the length of information.

The present invention proposes a newly designed QC-LDPC code in which the code rate thereof is 2/15 and the length of a codeword is 16200, as illustrated in the following Table 1. That is, the present invention proposes an LDPC code that is designed to receive information having a length of 2160 and generate an LDPC codeword having a length of 16200.

Table 1 illustrates the sizes of the matrices A, B, C, D and Z of the QC-LDPC code according to the present invention:

TABLE 1

| Code rate | Length | Sizes | | | | |
|---|---|---|---|---|---|---|
| | | A | B | C | D | Z |
| 2/15 | 16200 | 3240 × 2160 | 3240 × 3240 | 10800 × 5400 | 10800 × 10800 | 3240 × 10800 |

The newly designed LDPC code may be represented in the form of a sequence (progression), an equivalent relationship is established between the sequence and matrix (parity bit check matrix), and the sequence may be represented, as follows:

Sequence Table

1st row: 2889 3122 3208 4324 5968 7241 13215
2nd row: 281 923 1077 5252 6099 10309 11114
3rd row: 727 2413 2676 6151 6796 8945 12528
4th row: 2252 2322 3093 3329 8443 12170 13748
5th row: 575 2489 2944 6577 8772 11253 11657
6th row: 310 1461 2482 4643 4780 6936 11970
7th row: 8691 9746 10794 13582
8th row: 3717 6535 12470 12752
9th row: 6011 6547 7020 11746
10th row: 5309 6481 10244 13824
11st row: 5327 8773 8824 13343
12nd row: 3506 3575 9915 13609
13rd row: 3393 7089 11048 12816
14th row: 3651 4902 6118 12048
15th row: 4210 10132 13375 13377

An LDPC code that is represented in the form of a sequence is being widely used in the DVB standard.

According to an embodiment of the present invention, an LDPC code presented in the form of a sequence is encoded, as follows. It is assumed that there is an information block $S=(s_0, s_1, \ldots, s_{K-1})$ having an information size K. The LDPC encoder generates a codeword $\Lambda=(\lambda_0, \lambda_1, \lambda_2, \ldots, \lambda_{N-1})$ having a size of $N=K+M_1+M_2$ using the information block S having a size K. In this case, $M_1=g$, and $M_2=N-K-g$. Furthermore, $M_1$ is the size of parity bits corresponding to the dual diagonal matrix B, and $M_2$ is the size of parity bits corresponding to the identity matrix D. The encoding process is performed, as follows:

Initialization:

$$\lambda_i = s_i \text{ for } i=0,1,\ldots,K-1$$

$$p_j = 0 \text{ for } j=0,1,\ldots,M_1+M_2-1 \quad (4)$$

First information bit $\lambda_0$ is accumulated at parity bit addresses specified in the 1st row of the sequence of the Sequence Table. For example, in an LDPC code having a length of 16200 and a code rate of 2/15, an accumulation process is as follows:

$p_{2889} = p_{2889} \oplus \lambda_0$  $p_{3122} = p_{3122} \oplus \lambda_0$  $p_{3208} = p_{3208} \oplus \lambda_0$  $p_{4324} = p_{4324} \oplus \lambda_0$  $p_{5968} = p_{5968} \oplus \lambda_0$  $p_{7241} = p_{7241} \oplus \lambda_0$  $p_{13215} = p_{13215} \oplus \lambda_0$ where the addition $\oplus$ occurs in GF(2).

The subsequent L−1 information bits, that is, $\lambda_m$, m=1, 2, ..., L−1, are accumulated at parity bit addresses that are calculated by the following Equation 5:

$$(x+m \times Q_1) \bmod M_1 \text{ if } x < M_1$$

$$M_1 + \{(x-M_1+m \times Q_2) \bmod M_2\} \text{ if } x \geq M_1 \quad (5)$$

where x denotes the addresses of parity bits corresponding to the first information bit $\lambda_0$, that is, the addresses of the parity bits specified in the first row of the sequence of the Sequence Table, $Q_1=M_1/L$, $Q_2=M_2/L$, and L=360. Furthermore, $Q_1$ and $Q_2$ are defined in the following Table 2. For example, for an LDPC code having a length of 16200 and a code rate of 2/15, $M_1=3240$, $Q_1=9$, $M_2=10800$, $Q_2=30$ and L=360, and the following operations are performed on the second bit $\lambda_1$ using Equation 5:

$p_{2898} = p_{2898} \oplus \lambda_1$  $p_{3131} = p_{3131} \oplus \lambda_1$  $p_{3217} = p_{3217} \oplus \lambda_1$  $p_{4354} = p_{4354} \oplus \lambda_1$  $p_{5998} = p_{5998} \oplus \lambda_1$  $p_{7271} = p_{7271} \oplus \lambda_1$  $p_{13245} = p_{13245} \oplus \lambda_1$ Table 2 illustrates the sizes of $M_1$, $Q_1$, $M_2$ and $Q_2$ of the designed QC-LDPC code:

TABLE 2

| Code rate | Length | Sizes | | | |
|---|---|---|---|---|---|
| | | $M_1$ | $M_2$ | $Q_1$ | $Q_2$ |
| 2/15 | 16200 | 3240 | 10800 | 9 | 30 |

The addresses of parity bit accumulators for new 360 information bits from $\lambda_L$ to $\lambda_{2L-1}$ are calculated and accumulated from Equation 5 using the second row of the sequence.

In a similar manner, for all groups composed of new L information bits, the addresses of parity bit accumulators are calculated and accumulated from Equation 5 using new rows of the sequence.

After all the information bits from $\lambda_0$ to $\lambda_{K-1}$ have been exhausted, the operations of the following Equation 6 are sequentially performed from i=1:

$$p_i = p_i \oplus p_{i-1} \text{ for } i=0,1,\ldots,M_1-1 \quad (6)$$

Thereafter, when a parity interleaving operation, such as that of the following Equation 7, is performed, parity bits corresponding to the dual diagonal matrix B are generated:

$$\lambda_{K+L \cdot t+s} = p_{Q_1 \cdot s+t} \text{ for } 0 \leq s < L, \ 0 \leq t < Q_1 \quad (7)$$

When the parity bits corresponding to the dual diagonal matrix B have been generated using K information bits $\lambda_0, \lambda_1, \ldots, \lambda_{K-1}$, parity bits corresponding to the identity matrix D are generated using the $M_1$, generated parity bits $\lambda_K$, $\lambda_{K+1}, \ldots, \lambda_{K+M_1-1}$.

For all groups composed of L information bits from $\lambda_K$ to $\lambda_{K+M_1-1}$, the addresses of parity bit accumulators are calculated using the new rows (starting with a row immediately subsequent to the last row used when the parity bits corresponding to the dual diagonal matrix B have been generated) of the sequence and Equation 5, and related operations are performed.

When a parity interleaving operation, such as that of the following Equation 8, is performed after all the information bits from $\lambda_K$ to $\lambda_{K+M_1-1}$ have been exhausted, parity bits corresponding to the identity matrix D are generated:

$$\lambda_{K+M_1+L \cdot t+s} = p_{M_1+Q_2 \cdot s+t} \text{ for } 0 \leq s < L, \ 0 \leq t < Q_2 \quad (8)$$

Figure 4:
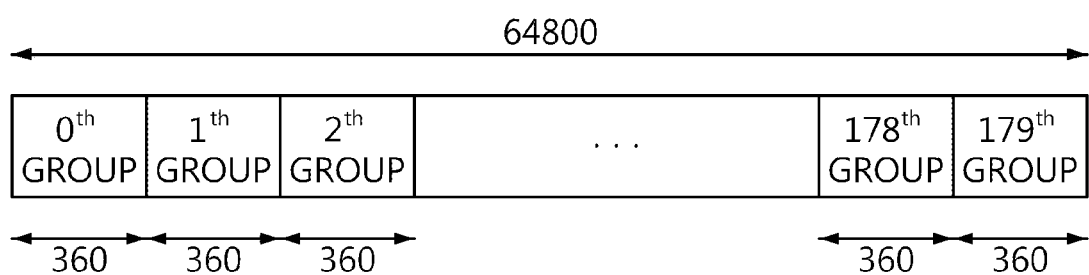
FIG. 4 is a diagram illustrating the bit groups of an LDPC codeword having a length of 64800.

FIG. 4 is a diagram illustrating the bit groups of an LDPC codeword having a length of 64800.

Referring to FIG. 4, it can be seen that an LDPC codeword having a length of 64800 is divided into 180 bit groups (a 0th group to a 179th group).

In this case, 360 may be the parallel factor (PF) of the LDPC codeword. That is, since the PF is 360, the LDPC codeword having a length of 64800 is divided into 180 bit groups, as illustrated in FIG. 4, and each of the bit groups includes 360 bits.

Figure 5:
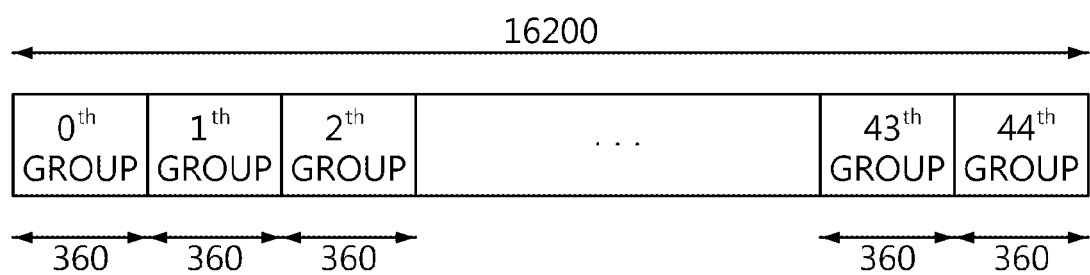
FIG. 5 is a diagram illustrating the bit groups of an LDPC codeword having a length of 16200.

FIG. 5 is a diagram illustrating the bit groups of an LDPC codeword having a length of 16200.

Referring to FIG. 5, it can be seen that an LDPC codeword having a length of 16200 is divided into 45 bit groups (a 0th group to a 44th group).

In this case, 360 may be the parallel factor (PF) of the LDPC codeword. That is, since the PF is 360, the LDPC codeword having a length of 16200 is divided into 45 bit groups, as illustrated in FIG. 5, and each of the bit groups includes 360 bits.

Figure 6:
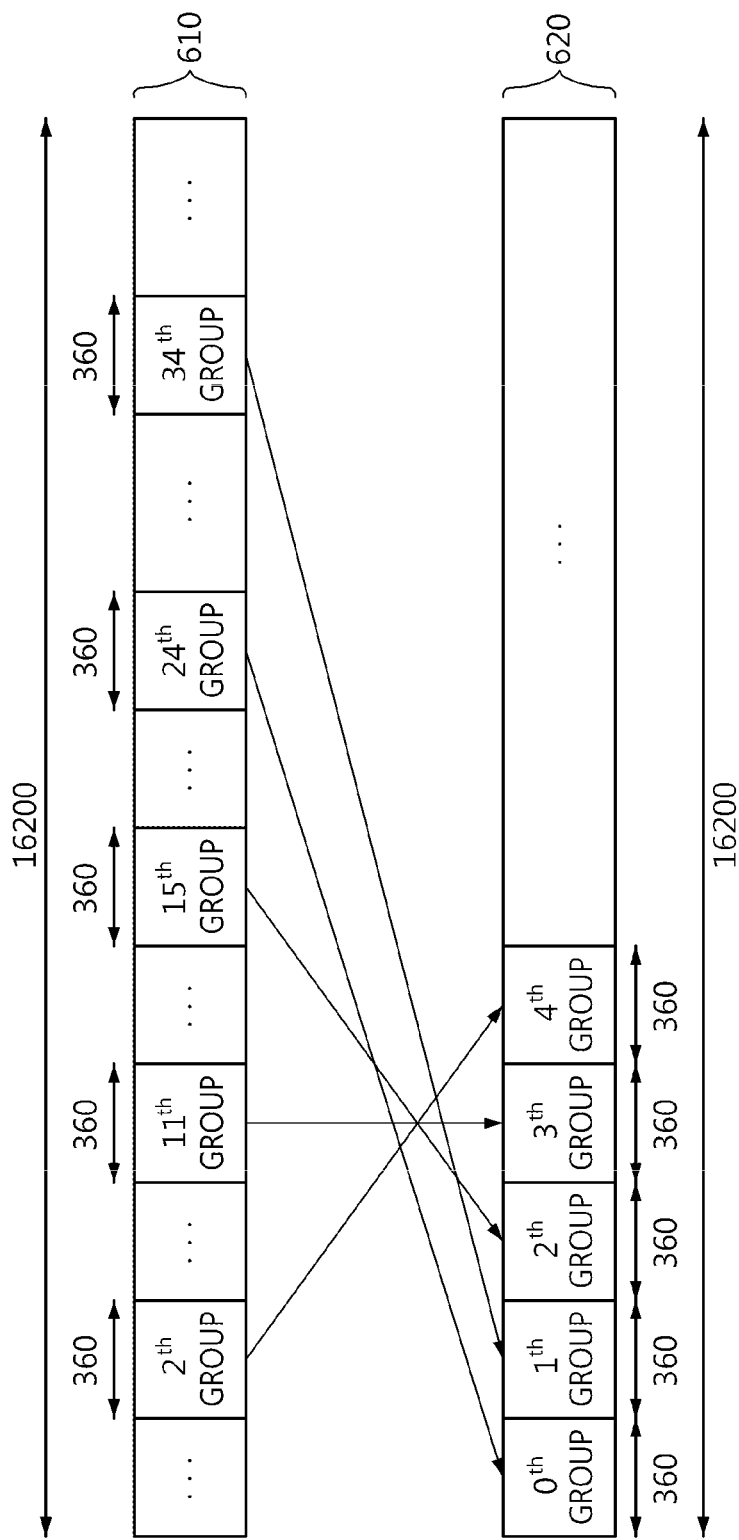
FIG. 6 is a diagram illustrating interleaving that is performed on a bit group basis in accordance with an interleaving sequence.

FIG. 6 is a diagram illustrating interleaving that is performed on a bit group basis in accordance with an interleaving sequence.

Referring to FIG. 6, it can be seen that interleaving is performed by changing the order of bit groups by a designed interleaving sequence.

For example, it is assumed that an interleaving sequence for an LDPC codeword having a length of 16200 is as follows:
interleaving sequence={24 34 15 11 2 28 17 25 5 38 19 13 6 39 1 14 33 37 29 12 42 31 30 32 36 40 26 35 44 4 16 8 20 43 21 7 0 18 23 3 10 41 9 27 22}

Then, the order of the bit groups of the LDPC codeword illustrated in FIG. 4 is changed into that illustrated in FIG. 6 by the interleaving sequence.

That is, it can be seen that each of the LDPC codeword 610 and the interleaved codeword 620 includes 45 bit groups, and it can be also seen that, by the interleaving sequence, the 24th bit group of the LDPC codeword 610 is changed into the 0th bit group of the interleaved LDPC codeword 620, the 34th bit group of the LDPC codeword 610 is changed into the 1st bit group of the interleaved LDPC codeword 620, the 15th bit group of the LDPC codeword 610 is changed into the 2nd bit group of the interleaved LDPC codeword 620, and the 11st bit group of the LDPC codeword 610 is changed into the 3rd bit group of the interleaved LDPC codeword 620, and the 2nd bit group of the LDPC codeword 610 is changed into the 4th bit group of the interleaved LDPC codeword 620.

An LDPC codeword $(u_0, u_1, \ldots, u_{N_{ldpc}-1})$ having a length of $N_{ldpc}$ ($N_{ldpc}=16200$) is divided into $N_{group}=N_{ldpc}/360$ bit groups, as in Equation 9 below:

$$X_j = \{u_k | 360 \times j \leq k < 360 \times (j+1), 0 \leq k < N_{ldpc}\} \text{ for } 0 \leq j < N_{group} \quad (9)$$

where $X_j$ is an j-th bit group, and each $X_j$ is composed of 360 bits.

The LDPC codeword divided into the bit groups is interleaved, as in Equation 10 below:

$$Y_j = X_{\pi(j)} 0 \leq j \leq N_{group} \quad (10)$$

where $Y_j$ is an interleaved j-th bit group, and $\pi(j)$ is a permutation order for bit group-based interleaving (bit group-unit interleaving). The permutation order corresponds to the interleaving sequence of Equation 11 below:

interleaving sequence={5 33 18 8 29 10 21 14 30 26
11 23 27 4 7 6 24 44 38 31 34 43 13 0 15 42
17 2 20 12 40 39 35 32 1 3 41 37 9 25 19 22
16 28 36} (11)

That is, when each of the codeword and the interleaved codeword includes 45 bit groups ranging from a 0th bit group to a 44th bit group, the interleaving sequence of Equation 11 means that the 5th bit group of the codeword becomes the 0th bit group of the interleaved codeword, the 33th bit group of the codeword becomes the 1st bit group of the interleaved codeword, the 18th bit group of the codeword becomes the 2nd bit group of the interleaved codeword, the 8th bit group of the codeword becomes the 3rd bit group of the interleaved codeword, . . . , the 28th bit group of the codeword becomes the 43rd bit group of the interleaved codeword, and the 36th bit group of the codeword becomes the 44th bit group of the interleaved codeword.

In particular, the interleaving sequence of Equation 11 has been optimized for a case where 16-symbol mapping (NUC symbol mapping) is employed and an LDPC coder having a length of 16200 and a code rate of 2/15 is used.

In general, broadcasting and communication systems use uniform quadrature amplitude modulation (QAM) in order to transmit error correction coded data.

Figure 7:
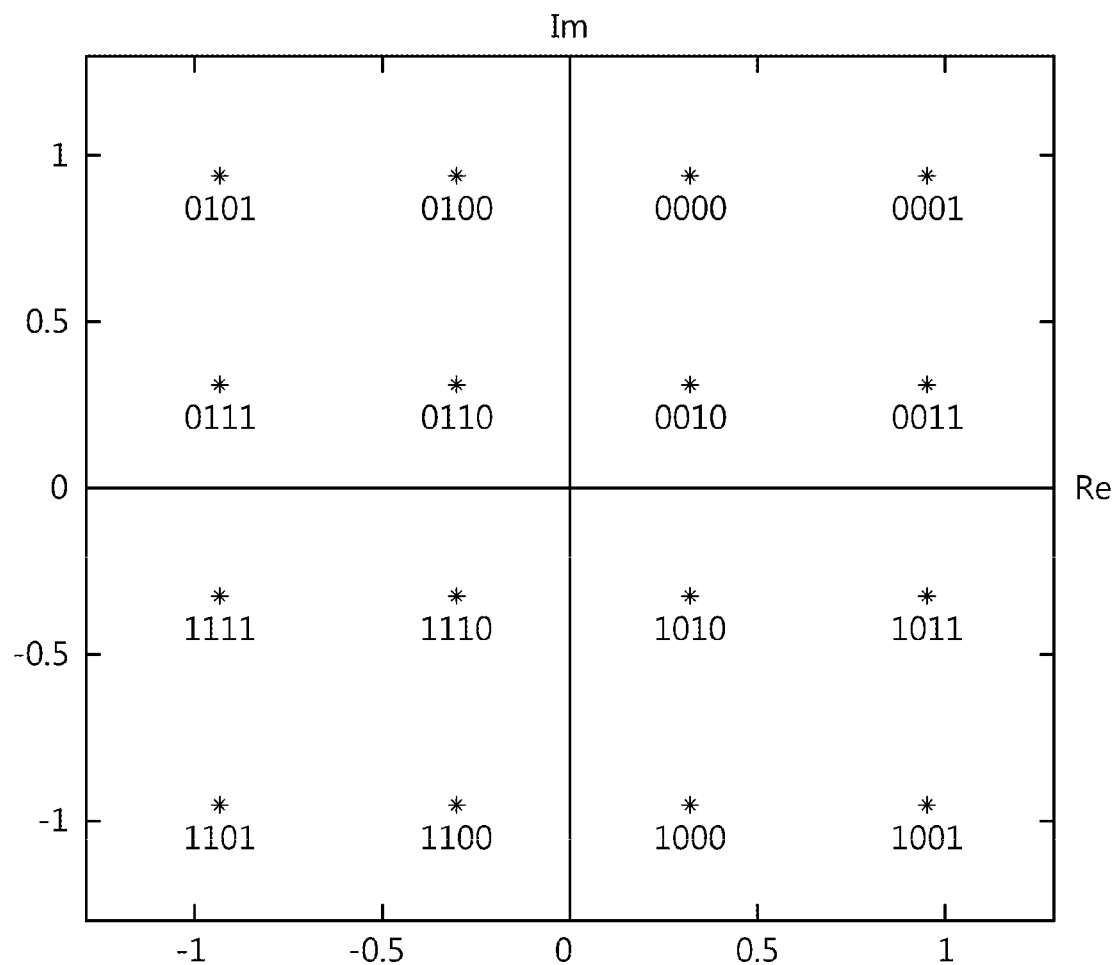
FIG. 7 is a diagram of a 16-QAM signal constellation.

FIG. 7 is a diagram of a 16-QAM signal constellation.

Referring to FIG. 7, it can be seen that the 16 symbols of a 16-QAM signal constellation to which 4 bits are mapped are uniformly distributed.

Although gray mapping is used for bit stream mapping between symbols in FIG. 7, other types of bit stream mapping may be used.

In the uniform 16-QAM signal constellation illustrated in FIG. 7, the distances between constellation points are uniform. Although uniform QAM has the advantage of being used regardless of the code rate of an error correction code, it exhibits lower performance than a non-uniform signal constellation specialized for a specific code rate. In theory, it is known that both the amplitude of a channel input signal (a transmission signal) and the amplitude of a channel itself follow a Gaussian distribution in an addictive white Gaussian noise (AWGN) channel environment, capacity, i.e., the mutual information between a transmission signal and a reception signal, is maximized. Based on this theoretical background, better performance can be achieved than a uniform constellation through the intentional distortion of a signal constellation.

Symmetric design technology may be used for the design of a non-uniform signal constellation.

That is, in the case of 16-QAM, after the four signal constellation symbols of a 1st quadrant have been designed first, the signal constellation symbols of the remaining three quadrants may be symmetrically designed.

For example, when the vector of the four signal constellation symbols of the 1st quadrant is $w=(w_0, w_1, w_2, w_3)$, the vectors of the signal constellation symbols of the remaining quadrants may be determined, as follows:

1st quadrant: $(w_0, w_1, w_2, w_3)=w$
2nd quadrant: $(w_4, w_5, w_6, w_7)=-\text{conj}(w)$
3rd quadrant: $(w_{12}, w_{13}, w_{14}, w_{15})=-w$
4th quadrant: $(w_8, w_9, w_{10}, w_{11})=\text{conj}(w)$ In this case, conj(w) may be a function that outputs the conjugate complex numbers of all the elements of w.

It will be apparent that the vectors of signal constellation symbols may be determined using other various methods.

A symbol $w_i$ may have a bit stream mapping value corresponding to a decimal value i. For example, $w_3=3_{(10)}=0010_{(2)}$.

If symmetric design technology is used when a non-uniform signal constellation is designed, the advantage of considerably reducing complexity is achieved.

In order to further reduce design complexity, it may be assumed that the amplitudes of the real and imaginary components of the vector w corresponding to four signal constellation symbols of the 1st quadrant are symmetric. That is, the amplitudes of the real and imaginary components of two of the four symbols of the 1st quadrant may be symmetric.

In this case, four pulse amplitude modulation (PAM) points rather than four complex numbers are designed. In this case, after the smallest PAM value has been set to 1 and the remaining three PAM values have been found, power may be normalized. As a result, based on the above-mentioned symmetry, when three PAM values are designed, a total of 16 signal constellations may be generated.

In general, in order to design $L=M^2$ signal constellations, it is sufficient if $(M-1)$ PAM values are designed.

When $(M-1)$ PAM values are obtained, the result obtained by the power normalization of the obtained $(M-1)$ PAM values and the smallest PAM value is defined as PAM_norm=$[P_1\ P_2\ \ldots\ P_M]$. When w is obtained using PAM_norm, the following expressions may be obtained based on the assumption that real and imaginary PAM values are symmetric:

$$|real(w_0)|=|imaginary(w_1)|$$

$$|real(w_1)|=|imaginary(w_0)|$$

$$|real(w_2)|=|imaginary(w_3)|$$

$$|real(w_3)|=|imaginary(w_2)|$$

where real(i) is a function that outputs the real component of i, imaginary(i) is a function that outputs the imaginary component of i, and i is an arbitrary complex number.

That is, when the real number values of the vector w corresponding to 1st quadrant symbols are defined, all the imaginary number values of w are defined accordingly. In the case of 16-QAM in which there are a total of four symbols in its 1st quadrant, a total of 4! (factorial)=4×3×2×1=24 combinational methods, as shown in Table 3 below. Table 3 below lists 24 methods of obtaining the vector w corresponding to the 1st quadrant symbols:

TABLE 3

| Method | Real of $w_0$ | Imaginary of $w_0$ | Real of $w_1$ | Imaginary of $w_1$ | Real of $w_2$ | Imaginary of $w_2$ | Real of $w_3$ | Imaginary of $w_3$ |
|---|---|---|---|---|---|---|---|---|
| 1 | $P_1$ | $P_2$ | $P_2$ | $P_1$ | $P_3$ | $P_4$ | $P_4$ | $P_3$ |
| 2 | $P_1$ | $P_2$ | $P_2$ | $P_1$ | $P_4$ | $P_3$ | $P_3$ | $P_4$ |
| 3 | $P_1$ | $P_3$ | $P_3$ | $P_1$ | $P_2$ | $P_4$ | $P_4$ | $P_2$ |
| 4 | $P_1$ | $P_3$ | $P_3$ | $P_1$ | $P_4$ | $P_2$ | $P_2$ | $P_4$ |
| 5 | $P_1$ | $P_4$ | $P_4$ | $P_1$ | $P_2$ | $P_3$ | $P_3$ | $P_2$ |
| 6 | $P_1$ | $P_4$ | $P_4$ | $P_1$ | $P_3$ | $P_2$ | $P_2$ | $P_3$ |
| 7 | $P_2$ | $P_1$ | $P_1$ | $P_2$ | $P_3$ | $P_4$ | $P_4$ | $P_3$ |
| 8 | $P_2$ | $P_1$ | $P_1$ | $P_2$ | $P_4$ | $P_3$ | $P_3$ | $P_4$ |
| 9 | $P_2$ | $P_3$ | $P_3$ | $P_2$ | $P_1$ | $P_4$ | $P_4$ | $P_1$ |
| 10 | $P_2$ | $P_3$ | $P_3$ | $P_2$ | $P_4$ | $P_1$ | $P_1$ | $P_4$ |
| 11 | $P_2$ | $P_4$ | $P_4$ | $P_2$ | $P_1$ | $P_3$ | $P_3$ | $P_1$ |
| 12 | $P_2$ | $P_4$ | $P_4$ | $P_2$ | $P_3$ | $P_1$ | $P_1$ | $P_3$ |
| 13 | $P_3$ | $P_1$ | $P_1$ | $P_3$ | $P_2$ | $P_4$ | $P_4$ | $P_2$ |
| 14 | $P_3$ | $P_1$ | $P_1$ | $P_3$ | $P_4$ | $P_2$ | $P_2$ | $P_4$ |
| 15 | $P_3$ | $P_2$ | $P_2$ | $P_3$ | $P_1$ | $P_4$ | $P_4$ | $P_1$ |
| 16 | $P_3$ | $P_2$ | $P_2$ | $P_3$ | $P_4$ | $P_1$ | $P_1$ | $P_4$ |
| 17 | $P_3$ | $P_4$ | $P_4$ | $P_3$ | $P_1$ | $P_2$ | $P_2$ | $P_1$ |
| 18 | $P_3$ | $P_4$ | $P_4$ | $P_3$ | $P_2$ | $P_1$ | $P_1$ | $P_2$ |
| 19 | $P_4$ | $P_1$ | $P_1$ | $P_4$ | $P_2$ | $P_3$ | $P_3$ | $P_2$ |
| 20 | $P_4$ | $P_1$ | $P_1$ | $P_4$ | $P_3$ | $P_2$ | $P_2$ | $P_3$ |
| 21 | $P_4$ | $P_2$ | $P_2$ | $P_4$ | $P_1$ | $P_3$ | $P_3$ | $P_1$ |
| 22 | $P_4$ | $P_2$ | $P_2$ | $P_4$ | $P_3$ | $P_1$ | $P_1$ | $P_3$ |
| 23 | $P_4$ | $P_3$ | $P_3$ | $P_4$ | $P_1$ | $P_2$ | $P_2$ | $P_1$ |
| 24 | $P_4$ | $P_3$ | $P_3$ | $P_4$ | $P_2$ | $P_1$ | $P_1$ | $P_2$ |

For example, an optimum PAM_norm value designed for an LDPC code having a code rate of 2/15 may be [0.7062 0.7075 0.7072 0.7077].

In this case, when the obtained PAM_norm is converted into the vector w corresponding to the 1st quadrant symbols using method 1 of Table 3, w=[0.7062+0.7075i 0.7075+0.7062i 0.7072+0.7077i 0.7077+0.7072i] can be obtained.

Table 4 below lists the 16 symbols of a non-uniform 16-symbol signal constellation optimized for an LDPC code having a code rate of 2/15. In general, since an error correction code has a varying operating SNR and error correction capability depending on the code rate, the performance of BICM can be maximized only when the value of the vector w optimized for each code rate is used. If a non-uniform signal constellation optimized for a specific code rate is used at a different code rate, the performance of BICM can be considerably reduced, and thus it is important to use a non-uniform signal constellation suitable for the code rate of an LDPC code:

TABLE 4

| w | Constellation |
|---|---|
| 0 | 0.7062 + 0.7075i |
| 1 | 0.7075 + 0.7062i |
| 2 | 0.7072 + 0.7077i |
| 3 | 0.7077 + 0.7072i |
| 4 | −0.7062 + 0.7075i |
| 5 | −0.7075 + 0.7062i |
| 6 | −0.7072 + 0.7077i |
| 7 | −0.7077 + 0.7072i |
| 8 | 0.7062 − 0.7075i |
| 9 | 0.7075 − 0.7062i |
| 10 | 0.7072 − 0.7077i |
| 11 | 0.7077 − 0.7072i |
| 12 | −0.7062 − 0.7075i |

TABLE 4-continued

| w | Constellation |
|---|---|
| 13 | −0.7075 − 0.7062i |
| 14 | −0.7072 − 0.7077i |
| 15 | −0.7077 − 0.7072i |

Figure 8A:
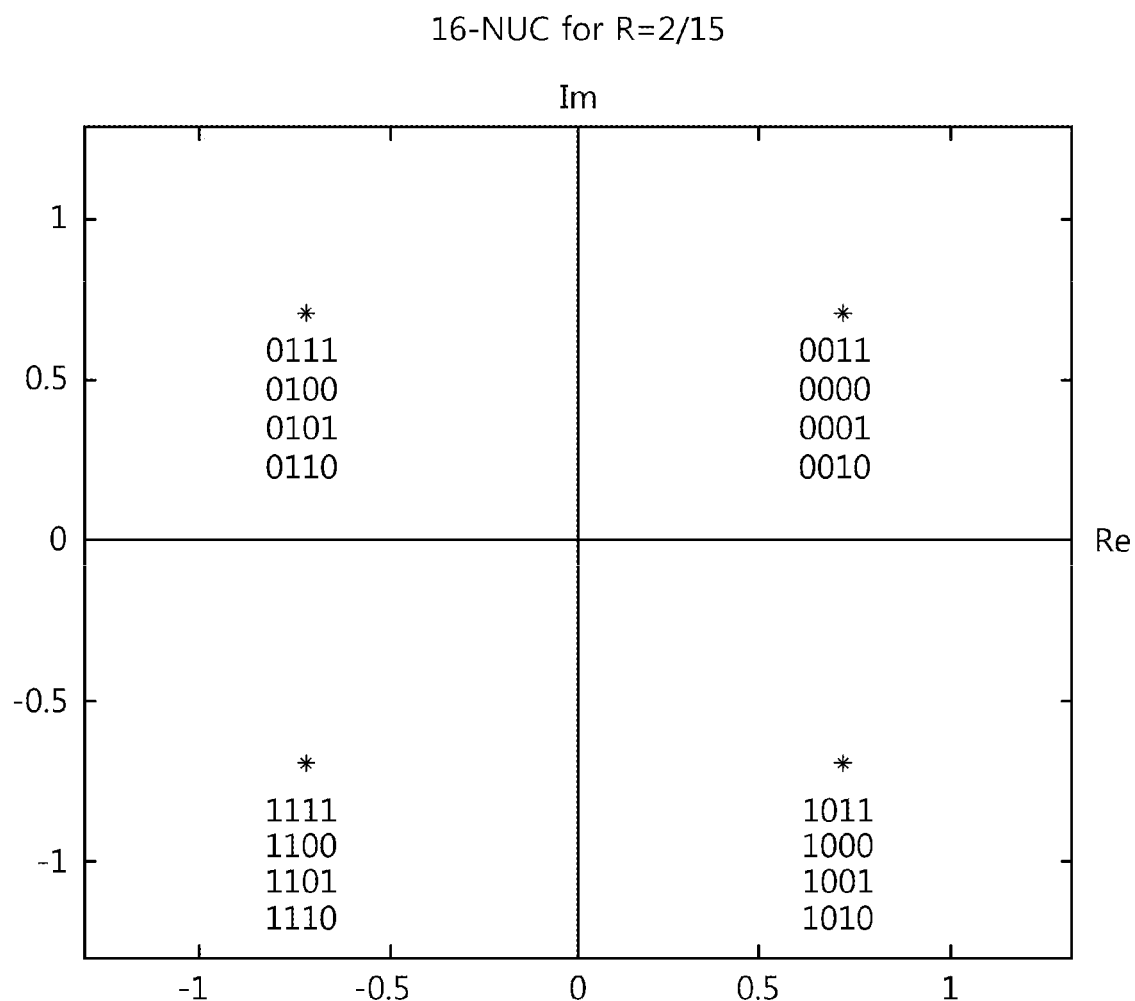
FIGS. 8A and 8B are diagrams of a non-uniform 16-symbol signal constellation optimized an LDPC code having a code rate of 2/15.
Figure 8B:
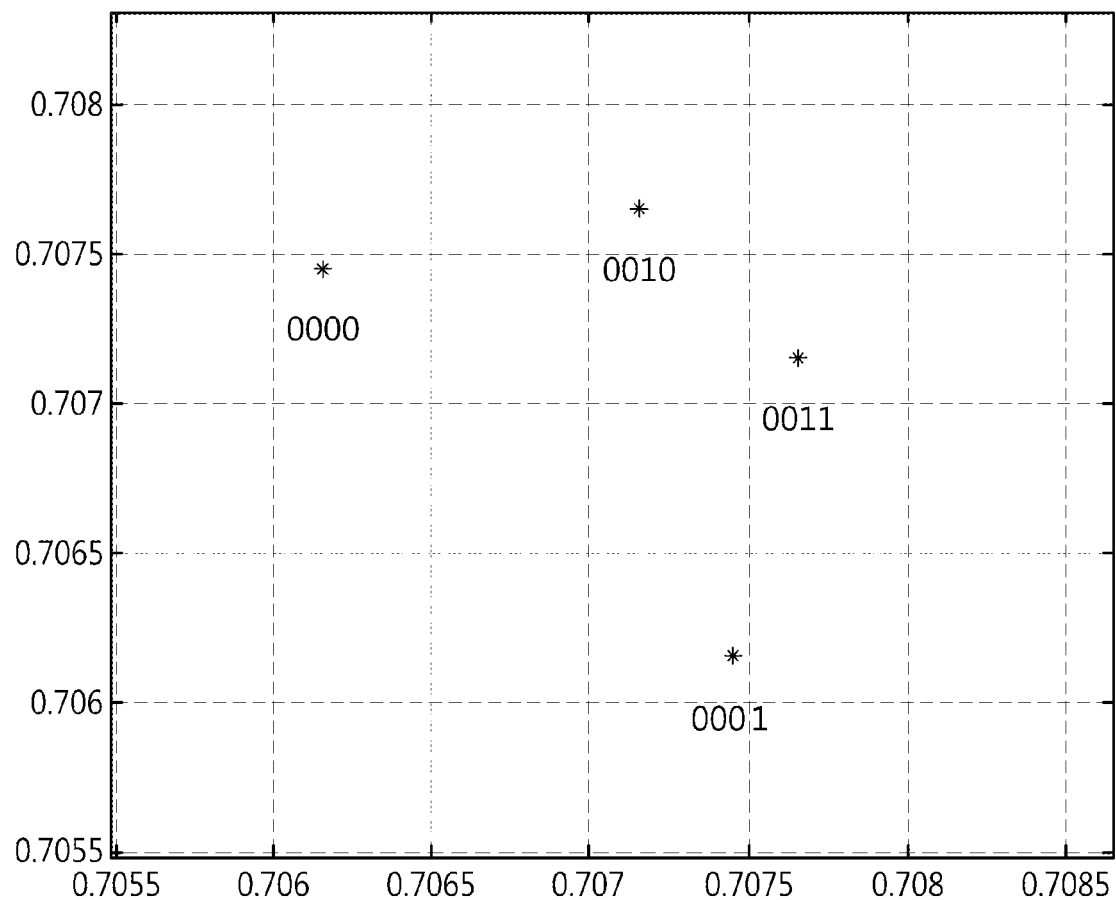

FIGS. 8A and 8B are a diagram of a non-uniform 16-symbol signal constellation optimized an LDPC code having a code rate of 2/15.

Referring to FIGS. 8A and 8B, it can be seen that the 16 symbols of a 16-QAM signal constellation to which 4 bits are mapped are non-uniformly distributed. In FIG. 8A, it looks like one symbol in each quadrant as four symbols in each quadrant are too close, but the locations of the four symbols in 1st quadrant are shown as in FIG. 8B.

FIGS. 8A and 8B illustrate a non-uniform 16-symbol signal constellation that is calculated based on a designed w. In this case, although the bit stream of each symbol illustrated in FIGS. 8A and 8B is represented based on gray mapping, other types of bit stream mapping may be applied.

In particular, FIG. 8B illustrates only 1st quadrant, the locations of the symbols in other quadrants may be generated by the locations of the symbols in the 1st quadrant as explained above.

Figure 9:
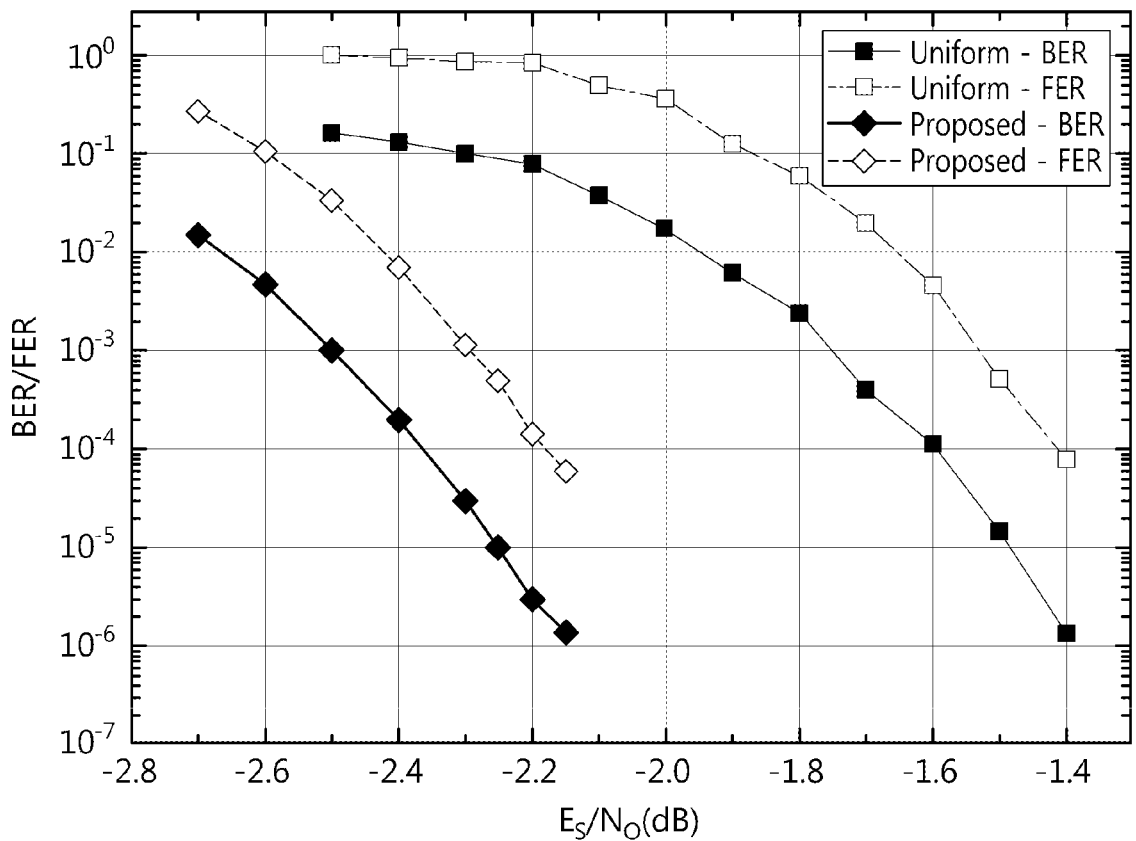
FIG. 9 is a graph illustrating the performance of the uniform signal constellation illustrated in FIG. 7 and the performance of the non-uniform signal constellation illustrated in FIG. 8A with respect to an LDPC code having a code rate of 2/15.

FIG. 9 is a graph illustrating the performance of the uniform signal constellation illustrated in FIG. 7 and the performance of the non-uniform signal constellation illustrated in FIGS. 8A and 8B with respect to an LDPC code having a code rate of 2/15.

Referring to FIG. 9, it can be seen that the bit error rates (BERs) and frame error rates (FERs) of the non-uniform signal constellation according to the present invention and uniform 16-QAM are illustrated. In FIG. 9, the non-uniform signal constellation exhibits superior performance compared to the uniform 16-QAM.

Figure 10:
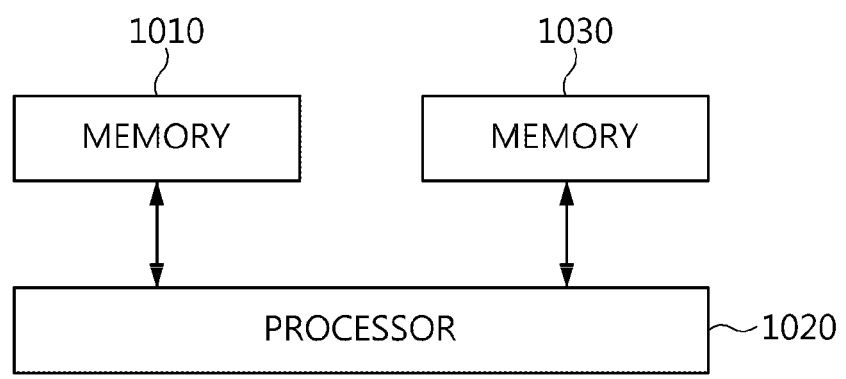
FIG. 10 is a block diagram of a modulator using a 16-symbol non-uniform signal constellation according to an embodiment of the present invention.

FIG. 10 is a block diagram of a modulator using a 16-symbol non-uniform signal constellation according to an embodiment of the present invention.

Referring to FIG. 10, the modulator using a 16-symbol non-uniform signal constellation according to an embodiment of the present invention includes memories 1010 and 1030 and a processor 1020. In this case, the modulator illustrated in FIG. 10 may correspond to the modulator 15 illustrated in FIG. 1.

The memory 1010 receives a codeword corresponding to an LDPC code having a code rate of 2/15.

In this case, the codeword may be an error correction coded LDPC codeword, and may be an LDPC codeword interleaved codeword.

The processor 1020 maps codewords to the 16 symbols of a non-uniform 16-symbol signal constellation on a 4-bit basis.

In this case, the processor 1020 may adjust any one of the amplitude and phase of a carrier corresponding to symbol mapping.

In this case, the 16 symbols have non-uniform distances therebetween, and may include a first group of four symbols of a 1st quadrant, a second group of four symbols symmetric to the four symbols of the first group with respect to an imaginary axis, a third group of four symbols symmetric to the four symbols of the first group with respect to an origin, and a fourth group of four symbols symmetric to the four symbols of the first group with respect to a real axis.

In this case, if a vector corresponding to the four symbols $w_0$, $w_1$, $w_2$ and $w_3$ of the first group is w, a vector corresponding to the four symbols $w_4$, $w_5$, $w_6$ and $w_7$ of the second group may be −conj(w) (conj(w) is a function that outputs the conjugate complex numbers of all the elements of w), a vector corresponding to the four symbols $w_{12}$, $w_{13}$, $w_{14}$ and $w_{15}$ of the third group may be −w, and a vector corresponding to the four symbols $w_8$, $w_9$, $w_{10}$ and $w_{11}$ of the fourth group may be conj(w).

In this case, the amplitudes of the real and imaginary components of two of the four symbols of the first group may be symmetric.

In this case, the four symbols of the first group are $w_0$, $w_1$, $w_2$ and $w_3$, |real($w_0$)|=|imaginary($w_1$)| (real(i) is a function that outputs the real component of i, imaginary(i) is a function that outputs the imaginary component of i, and i is an arbitrary complex number), |real($w_1$)|=|imaginary($w_0$)|, |real($w_2$)|=|imaginary($w_3$)|, and |real($w_3$)|=|imaginary($w_2$)|.

In this case, the 16 symbols may be defined as listed in the above Table 4.

The memory 1030 may store additional information required for the operation of the processor 1020. For example, the memory 1030 may store information about a carrier frequency, an amplitude, etc.

The memory 1010 and the memory 1030 may correspond to various pieces of hardware for storing a set of bits, and may correspond to data structures, such as an array, a list, a stack, a queue and the like.

In this case, the memory 1010 and the memory 1030 may not be separate physical devices, but may correspond to different addresses of a single physical device. That is, the memory 1010 and the memory 1030 may not be physically distinguished from each other, and may be only logically distinguished from each other.

Figure 11:
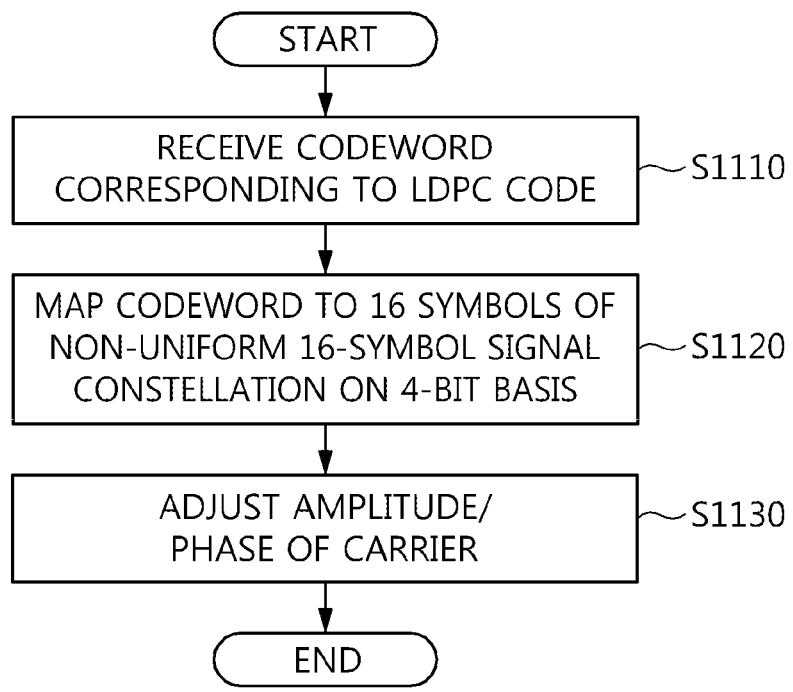
FIG. 11 is an operation flowchart of a modulation method using a 16-symbol non-uniform signal constellation according to an embodiment of the present invention.

FIG. 11 is an operation flowchart of a modulation method using a 16-symbol non-uniform signal constellation according to an embodiment of the present invention.

Referring to FIG. 11, in the modulation method using a 16-symbol non-uniform signal constellation according to the present embodiment, a codeword corresponding to an LDPC code having a code rate of 2/15 is received first at step S1110.

In this case, the codeword may be an error correction coded LDPC codeword or an LDPC codeword interleaved codeword. That is, at step S1110, the codeword may be received directly from an LDPC coder, or the codeword may be received by way of a bit interleaver.

Furthermore, in the modulation method using a 16-symbol non-uniform signal constellation according to the present embodiment, the codeword is mapped to the 16 symbols of the non-uniform 16-symbol signal constellation on a 4-bit basis at step S1120.

In this case, the 16 symbols have non-uniform distances therebetween, and may include a first group of four symbols of a 1st quadrant, a second group of four symbols symmetric to the four symbols of the first group with respect to an imaginary axis, a third group of four symbols symmetric to the four symbols of the first group with respect to an origin, and a fourth group of four symbols symmetric to the four symbols of the first group with respect to a real axis.

In this case, a vector corresponding to the four symbols $w_0$, $w_1$, $w_2$ and $w_3$ of the first group may be w, a vector corresponding to the four symbols $w_4$, $w_5$, $w_6$ and $w_7$ of the second group may be −conj(w) (conj(w) is a function that outputs the conjugate complex numbers of all the elements of w), a vector corresponding to the four symbols $w_{12}$, $w_{13}$, $w_{14}$ and $w_{15}$ of the third group may be −w, and a vector corresponding to the four symbols $w_8$, $w_9$, $w_{10}$ and $w_{11}$ of the fourth group may be conj(w).

In this case, the amplitudes of the real and imaginary components of two of the four symbols of the first group may be symmetric.

In this case, the four symbols of the first group are $w_0$, $w_1$, $w_2$ and $w_3$, $|real(w_0)|=|imaginary(w_1)|$ (real(i) is a function that outputs the real component of i, imaginary(i) is a function that outputs the imaginary component of i, and i is an arbitrary complex number), $|real(w_1)|=|imaginary(w_0)|$, $|real(w_2)|=|imaginary(w_3)|$, and $|real(w_3)|=|imaginary(w_2)|$.

In this case, the 16 symbols may be defined as listed in the above Table 4.

Furthermore, in the modulation method using a 16-symbol non-uniform signal constellation according to the present embodiment, any one or more of the amplitude and phase of a carrier are adjusted in accordance with the mapping at step S1130.

The error correction coder 13 illustrated in FIG. 1 may be implemented in a structure illustrated in FIG. 10.

That is, the error-correction coder may include memories and a processor. In this case, the first memory is a memory that stores an LDPC codeword having a length of 16200 and a code rate of 2/15, and a second memory is a memory that is initialized to 0.

The memories may correspond to $\lambda_i (i=0, 1, \ldots, N-1)$ and $P_j (j=0, 1, \ldots, M_1+M_2-1)$, respectively.

The processor may generate an LDPC codeword corresponding to information bits by performing accumulation with respect to the memory using a sequence corresponding to a parity check matrix (PCM).

In this case, the accumulation may be performed at parity bit addresses that are updated using the sequence of the above Sequence Table.

In this case, the LDPC codeword may include a systematic part $\lambda_0, \lambda_1, \ldots, \lambda_{K-1}$ corresponding to the information bits and having a length of 2160 (=K), a first parity part $\lambda_K, \lambda_{K+1}, \ldots, \lambda_{K+M_1-1}$, corresponding to a dual diagonal matrix included in the PCM and having a length of 3240 (=$M_1$=g), and a second parity part $\lambda_{K+M_1}, \lambda_{K+M_1+1}, \ldots, \lambda_{K+M_1+M_2-1}$ corresponding to an identity matrix included in the PCM and having a length of 10800 (=$M_2$).

In this case, the sequence may have a number of rows equal to the sum (2160/360+3240/360=15) of a value obtained by dividing the length of the systematic part, that is, 2160, by a CPM size L corresponding to the PCM, that is, 360, and a value obtained by dividing the length $M_1$ of the first parity part, that is, 3240, by 360.

As described above, the sequence may be represented by the above Sequence Table.

In this case, the second memory may have a size corresponding to the sum $M_1+M_2$ of the length $M_1$ of the first parity part and the length $M_2$ of the second parity part.

In this case, the parity bit addresses may be updated based on the results of comparing each x of the previous parity bit addresses, specified in respective rows of the sequence, with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$, may be $M_1/L$, $M_1$, may be the size of the first parity part, $Q_2$ may be $M_2/L$, and $M_2$ may be the size of the second parity part.

In this case, it may be possible to perform the accumulation while repeatedly changing the rows of the sequence by the CPM size L (=360) of the PCM, as described above.

In this case, the first parity part $\lambda_K, \lambda_{K+1}, \ldots, \lambda_{K+M_1-1}$ may be generated by performing parity interleaving using the first memory and the second memory, as described in conjunction with Equation 7.

In this case, the second parity part $\lambda_{K+M_1}, \lambda_{K+M_1+1}, \ldots, \lambda_{K+M_1+M_2-1}$ may be generated by performing parity interleaving using the first memory and the second memory after generating the first parity part $\lambda_K, \lambda_{K+1}, \ldots, \lambda_{K+M_1-1}$ and then performing the accumulation using the first parity part $\lambda_K, \lambda_{K+1}, \ldots, \lambda_{K+M_1-1}$ and the sequence, as described in conjunction with Equation 8.

The bit interleaver 14 illustrated in FIG. 1 may be also implemented in a structure illustrated in FIG. 10.

That is, the first memory may store an LDPC codeword having a length of 16200 and a code rate of 2/15. The processor may generate an interleaved codeword by interleaving the LDPC codeword on a bit group basis, in which the bit group corresponds to the parallel factor of the LDPC codeword. In this case, the parallel factor may be 360. In this case, the bit group may include 360 bits. In this case, the LDPC codeword may be divided into 45 bit groups, as represented by Equation 9.

In this case, the interleaving may be performed using Equation 10 using permutation order.

In this case, the permutation order may correspond to the interleaving sequence represented by Equation 11.

The second memory provides the interleaved codeword to the modulator for 16-symbol mapping.

In this case, the modulator may be a symbol mapping device for non-uniform constellation (NUC) symbol mapping, as described in conjunction with FIG. 10.

In accordance with at least one embodiment of the present invention, a signal constellation signal constellation for the transmission of error correction coded data in a next-generation broadcast system is intentionally distorted, thereby achieving considerably improved performance compared to a uniform signal constellation.

In accordance with at least one embodiment of the present invention, a non-uniform 16-symbol signal constellation is optimized for an LDPC coder having a code rate of 2/15 and thus can be applied to next-generation broadcast systems, such as ATSC 3.0.

Although the specific embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. A BICM reception device, comprising:
    a demodulator configured to perform demodulation corresponding to 16-symbol mapping using 16 symbols of a non-uniform 16-symbol signal constellation;
    a bit deinterleaver configured to perform group-unit deinterleaving on interleaved values, the interleaved values generated after the demodulation; and
    a decoder configured to restore information bits by LDPC-decoding deinterleaved values generated based on the group-unit deinterleaving, the deinterleaved values corresponding to a LDPC codeword having a code rate of 2/15,
    wherein the group-unit deinterleaving is performed on a group basis, the size of the group corresponding to a parallel factor of the LDPC codeword,
    wherein the 16 symbols are defined as shown in the following Table:

TABLE

| w | Constellation |
|---|---|
| 0 | 0.7062 + 0.7075i |
| 1 | 0.7075 + 0.7062i |
| 2 | 0.7072 + 0.7077i |
| 3 | 0.7077 + 0.7072i |
| 4 | −0.7062 + 0.7075i |
| 5 | −0.7075 + 0.7062i |
| 6 | −0.7072 + 0.7077i |
| 7 | −0.7077 + 0.7072i |
| 8 | 0.7062 − 0.7075i |
| 9 | 0.7075 − 0.7062i |
| 10 | 0.7072 − 0.7077i |
| 11 | 0.7077 − 0.7072i |
| 12 | −0.7062 − 0.7075i |
| 13 | −0.7075 − 0.7062i |
| 14 | −0.7072 − 0.7077i |
| 15 | −0.7077 − 0.7072i |

2. The BICM reception device of claim 1, wherein the 16 symbols have non-uniform distances therebetween, and comprise a first group of four symbols of a 1st quadrant, a second group of four symbols symmetric to the four symbols of the first group with respect to an imaginary axis, a third group of four symbols symmetric to the four symbols of the first group with respect to an origin, and a fourth group of four symbols symmetric to the four symbols of the first group with respect to a real axis.

3. The BICM reception device of claim 2, wherein a vector corresponding to four symbols $w_0$, $w_1$, $w_2$, and $w_3$ of a first group is w, a vector corresponding to four symbols $w_4$, $w_5$, $w_6$ and $w_7$ of a second group is −conj(w) (conj(w) is a function that outputs conjugate complex numbers of all elements of w), a vector corresponding to four symbols $w_{12}$, $w_{13}$, $w_{14}$ and $w_{15}$ of a third group is −w, and a vector corresponding to four symbols $w_8$, $w_9$, $w_{10}$ and $w_{11}$ of a fourth group is conj(w).

4. The BICM reception device of claim 3, wherein amplitudes of real and imaginary components of two of the four symbols of each group are symmetric.

5. The BICM reception device of claim 4, wherein the four symbols of the first group are $w_0$, $w_1$, $w_2$ and $w_3$, |real($w_0$)|=|imaginary($w_1$)| (real(i) is a function that outputs a real component of i, imaginary(i) is a function that outputs an imaginary component of i, and i is an arbitrary complex number), |real($w_1$)|=|imaginary($w_0$)|, |real($w_2$)|=|imaginary($w_3$)|, and |real($w_3$)|=|imaginary($w_2$)|.

6. A BICM reception method, comprising:
performing demodulation corresponding to 16-symbol mapping using 16 symbols of a non-uniform 16-symbol signal constellation;
performing group-unit deinterleaving on interleaved values, the interleaved values generated after the demodulation; and
restoring information bits by LDPC-decoding deinterleaved values generated based on the group-unit deinterleaving, the deinterleaved values corresponding to a LDPC codeword having a code rate of 2/15,
wherein the group-unit deinterleaving is performed on a group basis, the size of the group corresponding to a parallel factor of the LDPC codeword,
wherein the 16 symbols are defined as shown in the following Table:

TABLE

| w | Constellation |
|---|---|
| 0 | 0.7062 + 0.7075i |
| 1 | 0.7075 + 0.7062i |
| 2 | 0.7072 + 0.7077i |
| 3 | 0.7077 + 0.7072i |
| 4 | −0.7062 + 0.7075i |
| 5 | −0.7075 + 0.7062i |
| 6 | −0.7072 + 0.7077i |
| 7 | −0.7077 + 0.7072i |
| 8 | 0.7062 − 0.7075i |
| 9 | 0.7075 − 0.7062i |
| 10 | 0.7072 − 0.7077i |
| 11 | 0.7077 − 0.7072i |
| 12 | −0.7062 − 0.7075i |
| 13 | −0.7075 − 0.7062i |
| 14 | −0.7072 − 0.7077i |
| 15 | −0.7077 − 0.7072i |

\* \* \* \* \*